(12) United States Patent
Shum et al.

(10) Patent No.: US 10,755,007 B2
(45) Date of Patent: Aug. 25, 2020

(54) MIXED REALITY SIMULATION SYSTEM FOR TESTING VEHICLE CONTROL SYSTEM DESIGNS

(71) Applicant: TOYOTA JIDOSHA KABUSHIKI KAISHA, Toyota-shi, Aichi-ken (JP)

(72) Inventors: Jonathan Shum, Mountain View, CA (US); BaekGyu Kim, Mountain View, CA (US); Shinichi Shiraishi, Tokyo (JP)

( * ) Notice: Subject to any disclaimer, the term of this patent is extended or adjusted under 35 U.S.C. 154(b) by 0 days.

(21) Appl. No.: 15/982,190

(22) Filed: May 17, 2018

(65) Prior Publication Data
US 2019/0354643 A1    Nov. 21, 2019

(51) Int. Cl.
| G06F 30/00 | (2020.01) |
| G06F 30/20 | (2020.01) |
| G05D 1/00 | (2006.01) |
| G06T 19/00 | (2011.01) |
| G06F 30/15 | (2020.01) |

(52) U.S. Cl.
CPC ........... *G06F 30/20* (2020.01); *G05D 1/0088* (2013.01); *G06F 30/15* (2020.01); *G06T 19/006* (2013.01)

(58) Field of Classification Search
None
See application file for complete search history.

(56) References Cited

U.S. PATENT DOCUMENTS

| 7,828,655 | B2* | 11/2010 | Uhlir | A63F 13/12 |
| | | | | 463/30 |
| 8,190,295 | B1* | 5/2012 | Garretson | G05D 1/0038 |
| | | | | 700/245 |
| 9,760,806 | B1* | 9/2017 | Ning | G06N 3/0454 |
| 10,019,054 | B2* | 7/2018 | Lian | G06T 11/60 |
| 10,313,584 | B2* | 6/2019 | Pan | H04N 5/23238 |
| 10,334,050 | B2* | 6/2019 | Kentley-Klay | H04L 67/125 |
| 10,395,003 | B2* | 8/2019 | Yamaura | G06F 11/3664 |
| 2006/0040239 | A1* | 2/2006 | Cummins | G09B 9/05 |
| | | | | 434/62 |
| 2010/0305857 | A1* | 12/2010 | Byrne | G06T 7/73 |
| | | | | 701/301 |
| 2012/0105628 | A1* | 5/2012 | Fukuchi | G01M 9/067 |
| | | | | 348/135 |

(Continued)

FOREIGN PATENT DOCUMENTS

| EP | 1467319 | 10/2004 |
| JP | PO2004-019508 | 1/2004 |

*Primary Examiner* — Martin Mushambo
(74) *Attorney, Agent, or Firm* — Burbage Law, P.C.; Jon-Michael Burbage; Elizabeth Ruzich

(57) ABSTRACT

The disclosure includes a system, method, and tangible memory for generating a simulation. The method may include receiving real-world sensor stream data that describes a real-world data stream that is recorded by onboard sensors in one or more test vehicles, wherein the real-world sensor stream data describes real-world active agents and real-world environmental elements. The method may further include generating three-dimensional (3D) models of active agents and 3D models of environmental elements in a vehicle environment. The method may further include generating a simulation of the vehicle environment that synthesizes the real-world active agents with 3D models of active agents and synthesizes the real-world environmental elements with the 3D models of environmental elements.

20 Claims, 6 Drawing Sheets

(56) References Cited

U.S. PATENT DOCUMENTS

| | | | |
|---|---|---|---|
| 2012/0255350 A1* | 10/2012 | Nobles | G01M 9/067 73/147 |
| 2014/0012479 A1* | 1/2014 | Zhao | B60K 31/0008 701/96 |
| 2014/0047371 A1* | 2/2014 | Palmer | G06F 3/0484 715/771 |
| 2014/0195070 A1* | 7/2014 | Shimizu | G07C 5/0841 701/1 |
| 2014/0253541 A1* | 9/2014 | Schmidt | G06T 19/20 345/419 |
| 2014/0347475 A1* | 11/2014 | Divakaran | G06K 9/00771 348/135 |
| 2015/0103174 A1* | 4/2015 | Emura | B60R 1/00 348/148 |
| 2016/0071318 A1* | 3/2016 | Lee | G06T 17/00 345/419 |
| 2016/0259699 A1* | 9/2016 | Greenspan | G06F 11/263 |
| 2016/0259870 A1* | 9/2016 | Greenspan | G06F 17/5009 |
| 2017/0061036 A1* | 3/2017 | Schmidt | G06F 17/5009 |
| 2017/0126810 A1* | 5/2017 | Kentley | H04L 67/125 |
| 2017/0169627 A1* | 6/2017 | Kim | G07C 5/0808 |
| 2017/0253181 A1* | 9/2017 | Choi | B60Q 9/008 |
| 2017/0270236 A1* | 9/2017 | Yamaura | G06F 17/5009 |
| 2017/0341611 A1* | 11/2017 | Baker | B60R 11/04 |
| 2017/0372431 A1* | 12/2017 | Perl | G07C 5/085 |
| 2018/0089911 A1* | 3/2018 | Rath | G06Q 10/00 |
| 2018/0157770 A1* | 6/2018 | Kim | G06F 17/5095 |
| 2018/0190022 A1* | 7/2018 | Zamir | G06T 19/006 |
| 2018/0233061 A1* | 8/2018 | Rozenberg | G09B 9/48 |
| 2018/0267538 A1* | 9/2018 | Shum | G06F 17/5009 |
| 2018/0307305 A1* | 10/2018 | Babu | G06F 3/012 |
| 2018/0326999 A1* | 11/2018 | Hershkovitz | G06K 9/00335 |

* cited by examiner

US 10,755,007 B2

MIXED REALITY SIMULATION SYSTEM FOR TESTING VEHICLE CONTROL SYSTEM DESIGNS

BACKGROUND

The specification relates to a mixed reality simulation system for testing vehicle control system designs.

Advanced Driver Assistance Systems ("ADAS system" if singular, "ADAS systems" if plural) include autonomous vehicle control systems that need to be tested to ensure the safety of autonomous vehicles. Testing takes two forms: (1) real-world road testing, and (2) virtualized simulation testing methodologies.

Real-world testing methodologies record sensor data while a driver navigates roadways in the real world. Real-world testing is inadequate for designing ADAS systems because it is time consuming, expensive, fails to capture a wide enough range of driving scenarios, and risks collisions.

Virtualized simulation testing methodologies generate 3D virtual worlds from geometric models and estimate sensor data streams. Virtualized simulation testing methodologies are not as expensive as real-world road testing and do not risk collisions. However, virtualized simulations of road testing are inadequate for designing ADAS systems because it is not possible for a test engineer to design an entire virtual world with enough variation to yield accurate and reliable results that can be used to safely design an ADAS system.

SUMMARY

Vehicles increasing include one or more ADAS systems. ADAS systems are tested prior to their release to the public to confirm that they function correctly based on a specification of the ADAS system or some other known standard (e.g., a known government or industry safety standard).

One way of testing an ADAS system is to generate a virtualized world that includes a virtual vehicle operating on a virtual roadway included in a virtual road environment. The virtual vehicle may be modeled to include a virtualized version of the ADAS system that reacts in the virtualized world in a way that is the same or similar to how the real-world version of the ADAS system would react in the real-world.

Virtualization applications, such as CarSim™ and Prescan™, are increasingly used to test the correctness ADAS system included in a virtual vehicle modeled on a real-world vehicle. CarSim™ is produced and distributed by Mechanical Simulation Corporation of Ann Arbor, Mich. Prescan™ is produced and distributed by Tass International of Helmond, Netherlands. However, virtualization applications are limited because they either rely on real-world data or virtualization systems that lack sufficient information to safely design an ADAS system.

The above deficiencies are solved by using a mixed reality simulation application that combines real-world sensor stream data with 3D models to generate a simulation of a vehicle environment. The simulation can be used to test a design of an ADAS system by generating a visualization that includes a virtual vehicle (and the virtual version of the ADAS system) operating in a virtual road environment. The mixed reality simulation application monitors and measures the performance of the virtual version of the ADAS system to determine, for example, whether the virtual version of the ADAS system (and therefore, also the real world version of the ADAS system) is operating correctly (e.g., in accordance with a specification of the ADAS system, in accordance with an industry or government-established safety standard, in accordance with an expectation of the designer of the ADAS system, etc.).

A system of one or more computers can be configured to perform particular operations or actions by virtue of having software, firmware, hardware, or a combination of them installed on the system that in operation cause the system to perform the actions. One or more computer programs can be configured to perform particular operations or actions by virtue of including instructions that, when executed by data processing apparatus, cause the apparatus to perform the actions.

One general aspect includes a method that includes receiving real-world sensor stream data that describes a real-world data stream that is recorded by onboard sensors in one or more test vehicles, wherein the real-world sensor stream data describes real-world active agents and real-world environmental elements. The method further includes generating three-dimensional (3D) models of active agents and 3D models of environmental elements in a vehicle environment. The method further includes generating a simulation of the vehicle environment that synthesizes the real-world active agents with 3D models of active agents and synthesizes the real-world environmental elements with the 3D models of environmental elements.

Implementations may include one or more of the following features. In some embodiments, the real-world data stream includes a sensor stream for each of the onboard sensors in the one or more test vehicles and the simulation is generated from mixed-reality streams that are a mix of the sensor stream for each of the onboard sensors in the one or more test vehicles with the 3D models of active agents and the 3D models of environmental elements. In some embodiments, the method further includes recording response data from a control system that is exposed to the simulation, wherein the control system is associated with an ADAS system and updating the mixed-reality streams for each sensor based on the response data. In some embodiments, the method further includes modifying the ADAS system based on an update to the mixed-reality streams. In some embodiments, the real-world sensor stream data further describes real-world active agent trajectories, the method further comprises generating scripted behavior and mathematical models of active agent trajectories, and generating the simulation includes synthesizing the real-world active agent trajectories with the scripted behavior and the mathematical models of active agent trajectories. In some embodiments, the method further comprises providing initial conditions of the vehicle environment that includes the 3D models of active agents and recording response data from a control system associated with an autonomous vehicle. In some embodiments, the method further comprises comparing the response data to control system specifications to measure and assess an operation of the control system associated with the autonomous vehicle. In some embodiments, the method further comprises modifying an ADAS system based on measurement and assessment of the operation of the control system associated with the ADAS system.

One general aspect includes a system comprising one or more processors and a memory that stores instructions that, when executed by the one or more processors cause the one or more processors to perform operations comprising: receiving real-world sensor stream data that describes a real-world data stream that is recorded by onboard sensors in one or more test vehicles, wherein the real-world sensor stream data describes real-world active agents and real-world environmental elements, generating 3D models of active agents and 3D models of environmental elements in a vehicle environment, and generating a simulation of the vehicle environment that synthesizes the real-world active agents with 3D models of active agents and synthesizes the real-world environmental elements with the 3D models of environmental elements.

Embodiments may include one or more of the following features. The system where the real-world data stream includes a sensor stream for each of the onboard sensors in the one or more test vehicles and the simulation is generated from mixed-reality streams that are a mix of the sensor stream for each of the onboard sensors in the one or more test vehicles with the 3D models of active agents and the 3D models of environmental elements. The system where the memory stores additional instructions that, when executed by the one or more processors cause the one or more processors to perform operations comprising: recording response data from a control system that is exposed to the simulation, wherein the control system is associated with an ADAS system and updating the mixed-reality streams for each sensor based on the response data. The system where the memory stores additional instructions that, when executed by the one or more processors cause the one or more processors to perform operations comprising: modifying the ADAS system based on an update to the mixed-reality streams. The system where the real-world sensor stream data further describes real-world active agent trajectories, the memory stores additional instructions that, when executed by the one or more processors cause the one or more processors to perform operations comprising generating scripted behavior and mathematical models of active agent trajectories, and generating the simulation includes synthesizing the real-world active agent trajectories with the scripted behavior and the mathematical models of active agent trajectories. The system where the memory stores additional instructions that, when executed by the one or more processors cause the one or more processors to perform operations comprising: providing initial conditions of the vehicle environment that includes the 3D models of active agents and recording response data from a control system associated with an autonomous vehicle.

One general aspect includes a non-transitory computer-readable medium computer code which, when executed by a processor, causes the processor to perform steps comprising: receiving real-world sensor stream data that describes a real-world data stream that is recorded by onboard sensors in one or more test vehicles, wherein the real-world sensor stream data describes real-world active agents and real-world environmental elements, generating 3D models of active agents and 3D models of environmental elements in a vehicle environment, and generating a simulation of the vehicle environment that synthesizes the real-world active agents with 3D models of active agents and synthesizes the real-world environmental elements with the 3D models of environmental elements.

Embodiments may include one or more of the following features. The non-transitory memory where the real-world data stream includes a sensor stream for each of the onboard sensors in the one or more test vehicles and the simulation is generated from mixed-reality streams that are a mix of the sensor stream for each of the onboard sensors in the one or more test vehicles with the 3D models of active agents and the 3D models of environmental elements. The non-transitory memory where the steps further comprise: recording response data from a control system that is exposed to the simulation, wherein the control system is associated with an ADAS system and updating the mixed-reality streams for each sensor based on the response data. The non-transitory memory where the steps further comprise: modifying the ADAS system based on an update to the mixed-reality streams. The non-transitory memory where the real-world sensor stream data further describes real-world active agent trajectories, the steps further comprise generating scripted behavior and mathematical models of active agent trajectories, and generating the simulation includes synthesizing the real-world active agent trajectories with the scripted behavior and the mathematical models of active agent trajectories. The non-transitory memory where the steps further comprise: providing initial conditions of the vehicle environment that includes the 3D models of active agents and recording response data from a control system associated with an autonomous vehicle.

Accordingly, the specification describes a system that advantageously uses mixed reality to test the design of vehicle control systems, such as ADAS systems. The solution has multiple benefits. First, the system improves upon virtualized simulations of road testing by reducing the amount (i.e., number) of virtual elements that have to be constructed by a significant amount when compared to traditional virtualized simulations such as those provided by CarSim™ or Prescan™. For example, the system may be able to reuse recorded stream data by changing only a select number of pixels in the recorded stream to account for different simulation scenarios. As a result, the system reduces the processing time needed to perform testing of the vehicle control system because the system reduces the number of digital graphics that would ordinarily be needed to use simulation software. Second, the system is safer than existing solutions because the system uses more testing situations than a system that relies only on real-world examples. Furthermore, a driving scenario can be decomposed into components which can be recorded individually, and the system creates a more realistic simulation as compared to existing solutions. Third, the same snippets of recorded data can be used for multiple configurations of driving scenarios, and new driving scenarios can be generated by changing a select number of features in the scene. This flexibility is not provided by real-world testing. Fourth, the resulting sensor stream is more useful because the driving scenarios can be modified like a pure simulation but select portions of the scenario are directly derived from real world sensor streams. As a result, recorded behavior is used instead of relying on generalized behavior models.

BRIEF DESCRIPTION OF THE DRAWINGS

The disclosure is illustrated by way of example, and not by way of limitation in the figures of the accompanying drawings in which like reference numerals are used to refer to similar elements.

DETAILED DESCRIPTION

An automotive system may include a vehicle. Vehicles increasingly include one or more Advanced Driver Assistance Systems ("ADAS system" if singular, "ADAS systems" if plural). An ADAS system may provide one or more safety features. In some embodiments, one or more ADAS systems may cause a vehicle to operate as an autonomous vehicle.

Examples of ADAS systems include the following: an adaptive cruise control (ACC) system; an adaptive high beam system; an adaptive light control system; an automatic parking system; an automotive night vision system; a blind spot monitor; a collision avoidance system; a crosswind stabilization system; a driver drowsiness detection system; a driver monitoring system; an emergency driver assistance system; a forward collision warning system; an intersection assistance system; an intelligent speed adaption system; a lane departure warning system; a pedestrian protection system; a traffic sign recognition system; a turning assistant; and a wrong-way driving warning system.

A vehicle may include a plurality of ADAS systems. These ADAS systems may provide a plurality of safety features. These ADAS systems may be included in a safety system of a vehicle. The safety system may include one or more of the following: one or more control systems (e.g., an onboard vehicle computer, electronic control units (ECU), etc.); the plurality of ADAS systems; and one or more virtualization modules.

In some embodiments, one or more of the ADAS systems may be provided by a mixed reality simulation application that virtualizes the operation of one or more hardware, software, or firmware components to provide the functionality of an ADAS systems in the real world. For example, the mixed reality simulation application may include one or more a hypervisor and a virtual machine monitor that is stored in a non-transitory memory of the computing device. A processor (e.g., a processor of a control system, an onboard vehicle computer, or an ECU) may execute the hypervisor or the virtual machine monitor and, responsive to this execution, the hypervisor or the virtual machine monitor may cause the processor to create and run one or more virtual machines that provide virtualized hardware which are operable to provide a virtualized version of an ADAS system that provides one or more of the safety features described herein. In some embodiments, for this virtualization, the same application can be deployed among different kinds of vehicle platforms as different virtual runtime platforms. The mixed reality simulation application may run the one or more virtual machines by providing a simulation to the control system and/or compare the simulation to control system specification data.

Example System Overview

Figure 1:
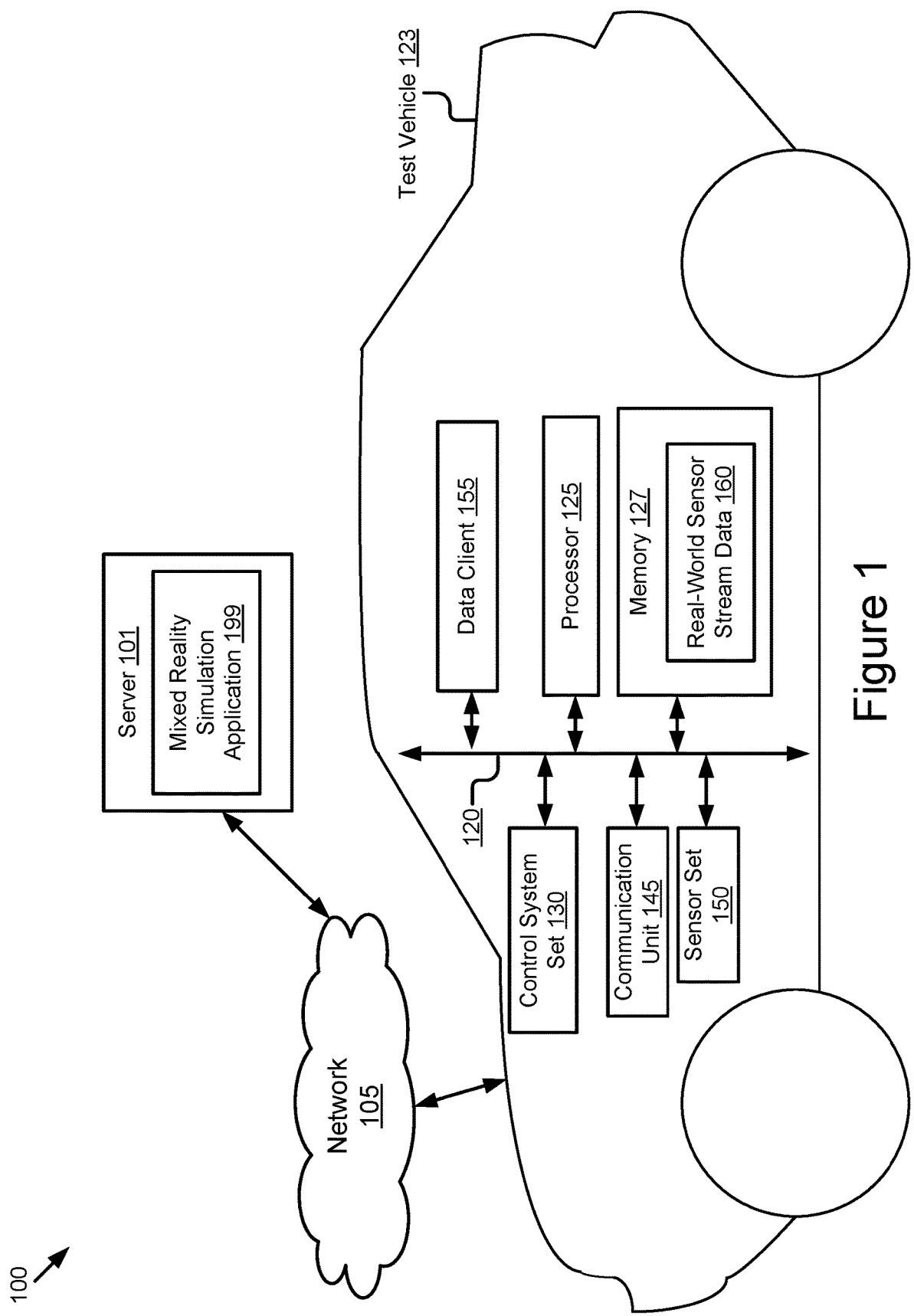
FIG. 1 is a block diagram illustrating an example operating environment for a mixed reality simulation system according to some embodiments.

FIG. 1 is a block diagram illustrating one embodiment of an operating environment 100 for a mixed reality simulation application 199. The operating environment 100 includes a server 101, a test vehicle 123, and a network 105.

The server 101 and the test vehicle 123 can be used by way of example. While FIG. 1 illustrates one server 101, one test vehicle 123, and one network 105, the operating environment 100 may include one or more servers 101, and one or more test vehicles 123. Furthermore, although FIG. 1 illustrates one network 105 coupled to the server 101 and the test vehicle 123, in practice one or more networks 105 can be connected to these entities.

The network 105 can be a conventional type, wired or wireless, and may have numerous different configurations including a star configuration, token ring configuration, or other configurations. Furthermore, the network 105 may include a local area network (LAN), a wide area network (WAN) (e.g., the Internet), or other interconnected data paths across which multiple devices may communicate. In some embodiments, the network 105 may be a peer-to-peer network. The network 105 may also be coupled to or include portions of a telecommunications network for sending data in a variety of different communication protocols. In some embodiments, the network 105 includes Bluetooth® communication networks or a cellular communications network for sending and receiving data via short messaging service (SMS), multimedia messaging service (MMS), hypertext transfer protocol (HTTP), direct data connection, WAP, e-mail, etc. The network 105 may be a mobile data network such as 3G, 4G, 5G, LTE, Voice-over-LTE ("VoLTE"), or any other mobile data network or combination of mobile data networks.

The test vehicle 123 is any type of connected vehicle that records sensor data. For example, the test vehicle 123 is one of the following types of vehicles: a car; a truck; a sports utility vehicle; a bus; a semi-truck; a drone or any other roadway-based conveyance.

The test vehicle 123 may include a processor 125, a memory 127, a control system set 130, a communication unit 145, a sensor set 150, and a data client 155 that are each connected to a bus 120.

The processor 125 includes an arithmetic logic unit, a microprocessor, a general-purpose controller, or some other processor array to perform computations and provide electronic display signals to a display device. The processor 125 processes data signals and may include various computing architectures including a complex instruction set computer (CISC) architecture, a reduced instruction set computer (RISC) architecture, or an architecture implementing a combination of instruction sets.

The memory 127 stores instructions or data that may be accessed and executed by the processor 125. The instructions or data may include code for performing the techniques described herein. The memory 127 may be a dynamic random-access memory (DRAM) device, a static random-access memory (SRAM) device, flash memory, or some other memory device. In some embodiments, the memory 127 also includes a non-volatile memory or similar permanent storage device and media including a hard disk drive, a floppy disk drive, a CD-ROM device, a DVD-ROM device, a DVD-RAM device, a DVD-RW device, a flash memory device, or some other mass storage device for storing information on a more permanent basis. A portion of the memory 127 may be reserved for use as a buffer or virtual random-access memory (virtual RAM). The test vehicle 123 may include one or more memories 127.

The memory 127 of the test vehicle 123 may store real-world sensor stream data 160 that includes: (1) sensor data that is digital data that describes the measurements recorded by the vehicle's onboard sensors that are included in the sensor set 150, system status indicators, and user inputs; and (2) ADAS data that is digital data that describes digital data recorded by the control system set 130 as well as vehicle dynamics information measured by the control system set 130. In some embodiments, the real-world sensor stream data 160 includes one or more of real-world environmental elements, real-world recorded active agents, and real-world active agent trajectories. The real-world sensor stream data 160 may include video or images recorded using the one or more onboard cameras that are part of the sensor set 150 in combination with sensor measurements taken by other onboard sensors such as a light detection and ranging (LIDAR) sensor, radar, ultrasonic sensors, etc. In some embodiments, the real-world sensor stream data 160 describes a sensor stream for each of the onboard sensors in the sensor set 150 of the one or more test vehicles.

The control system set 130 includes one or more ADAS systems. The ADAS systems provide one or more autonomous features to the test vehicle 123. In some embodiments, the test vehicle 123 is an autonomous vehicle, a semi-autonomous vehicle, or an HAV. For example, the test vehicle 123 includes a set of ADAS systems that provide autonomous features to the test vehicle 123, which are sufficient to render the test vehicle 123 an autonomous vehicle.

The ADAS systems may include one or more of the following elements: an ACC system; an adaptive high beam system; an adaptive light control system; an automatic parking system; an automotive night vision system; a blind spot monitor; a collision avoidance system; a crosswind stabilization system; a driver drowsiness detection system; a driver monitoring system; an emergency driver assistance system; a forward collision warning system; an intersection assistance system; an intelligent speed adaption system; a lane departure warning system (also referred to as a lane keep assistant); a pedestrian protection system; a traffic sign recognition system; a turning assistant; a wrong-way driving warning system; autopilot; sign recognition; and sign assist. Each of these example ADAS systems provide their own features and functionality that may be referred to herein as an "ADAS feature" or "ADAS functionality," respectively. The features and functionality provided by these example ADAS systems are also referred to herein as an "autonomous feature" or an "autonomous functionality," respectively.

The communication unit 145 may include hardware that transmits and receives data to and from the network 105. In some embodiments, the communication unit 145 may transmit real-world sensor stream data 160 to the server 101 via the network 105.

In some embodiments, the communication unit 145 includes a port for direct physical connection to the network 105 or to another communication channel. For example, the communication unit 145 includes a universal serial bus (USB), SD, CAT-5, or similar port for wired communication with the network 105. In some embodiments, the communication unit 145 includes a wireless transceiver for exchanging data with the network 105 or other communication channels using one or more wireless communication methods, including IEEE 802.11, IEEE 802.16, Bluetooth®, or another suitable wireless communication method.

In some embodiments, the communication unit 145 includes a cellular communications transceiver for sending and receiving data over a cellular communications network including via short messaging service (SMS), multimedia messaging service (MMS), hypertext transfer protocol (HTTP), direct data connection, WAP, e-mail, or another suitable type of electronic communication. In some embodiments, the communication unit 145 includes a wired port and a wireless transceiver. The communication unit 145 also provides other conventional connections to the network 105 for distribution of files or media objects using standard network protocols including TCP/IP, HTTP, HTTPS, and SMTP, etc.

The sensor set 150 includes any onboard sensors of the test vehicle 123 that measure, among other things: (1) the physical environment where the vehicle is located as well as environmental objects within this physical environment; (2) active agents within the physical environment and the behavior of these active agents; (3) the position of the test vehicle 123 relative to environmental objects and the active agents within the physical environment; (4) the weather within the physical environment over time and other natural phenomenon within the physical environment over time; (5) coefficients of friction and other variables describing environmental objects and active agents within the physical environment over time; and (6) the operation of the control system set 130 in response to the environmental objects and active agents.

In some embodiments, the sensor set 150 of the test vehicle 123 may include one or more of the following vehicle sensors: a vibrometer; a collision detection system; an engine oil pressure detection sensor; a camera (e.g., one or more of an internal camera and an external camera); LIDAR; an ultrasonic sensor; a radar sensor; a laser altimeter; an infrared detector; a motion detector; a thermostat; a sound detector, a carbon monoxide sensor; a carbon dioxide sensor; an oxygen sensor; a mass air flow sensor; an engine coolant temperature sensor; a throttle position sensor; a crank shaft position sensor; an automobile engine sensor; a valve timer; an air-fuel ratio meter; a blind spot meter; a curb feeler; a defect detector; a Hall effect sensor, a manifold absolute pressure sensor; a parking sensor; a radar gun; a speedometer; a speed sensor; a tire-pressure monitoring sensor; a torque sensor; a transmission fluid temperature sensor; a turbine speed sensor (TSS); a variable reluctance sensor; a vehicle speed sensor (VSS); a water sensor; a wheel speed sensor; and any other type of automotive sensor. In some embodiments, the sensor set 150 includes a global positioning system (GPS) unit that determines a location of the test vehicle 123 and includes the location as part of the real-world sensor stream data 160. The sensor set 150 incorporates the sensor data generated by these onboard sensors into the real-world sensor stream data 160 stored in the memory 127.

The data client 155 may include hardware or software that causes the sensor set 150 to record the real-world sensor stream data 160 and provide the real-world sensor stream data 160 to the server 101. The data client 155 may instruct the sensor set 150 to record the real-world sensor stream data 160 from a known road at a certain time of day or from multiple times of data. For example, the data client 155 may send recording instructions to the sensor set 150 to record the roadway when the roadway is empty. In another example, the data client 155 may instruct the sensor set 150 to initially record an empty roadway and then record the roadway with active agents on it. In some embodiments, the data client 155 instructs the communication unit 145 to transmit the real-world sensor stream data 160 to the server 101 via the network 105.

The server 101 may include hardware or software for generating a mixed reality simulation that tests vehicle control system designs. The server 101 may include a mixed reality simulation application 199. The mixed reality simulation application 199 is discussed in greater detail below with reference to FIG. 2. Although the mixed reality simulation application 199 is illustrated as being entirely stored on the server 101, in some embodiments, some or all components of the mixed reality simulation application 199 are stored in the test vehicle 123.

In some embodiments, the mixed reality simulation application 199 includes code and routines configured to perform one or more steps of the method 500 described below with reference to FIG. 5 when executed by a processor, such as processor 225, described below with reference to FIG. 2. In some embodiments, the mixed reality simulation application 199 is standalone software for generating a simulation. In other embodiments, the mixed reality simulation application 199 is a plug-in for existing simulation software.

The mixed reality simulation application 199 may receive the real-world sensor stream data 160 and extract real-world active agents, real-world active agent trajectories, and real-world environmental elements from the real-world sensor stream data 160. The mixed reality simulation application 199 may synthesize the real-world active agents, real-world active agent trajectories, and real-world environmental elements with three-dimensional models to create a simulation of the vehicle environment. The mixed reality simulation application 199 may use the simulation to assess the operation of an ADAS vehicle's control system.

Example Electronic Devices

Figure 2:
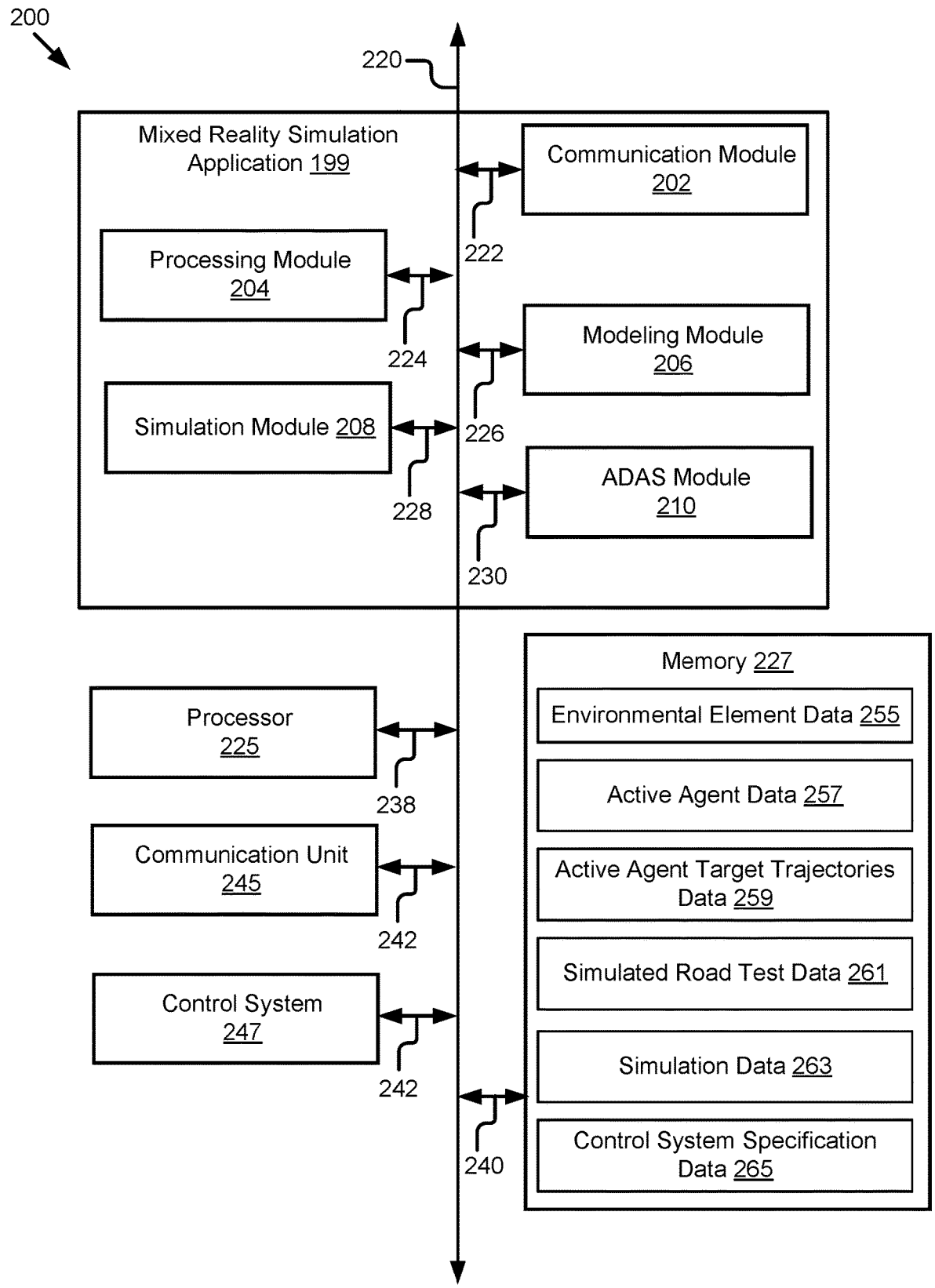
FIG. 2 is a block diagram illustrating a computing device including a mixed reality simulation application according to some embodiments.

FIG. 2 is a block diagram illustrating an example computing device 200 including a mixed reality simulation application 199. In some embodiments, the computing device 200 may include a processor 225, a memory 227, a communication unit 245, a control system 247, and a mixed reality simulation application 199. The computing device 200 may include an electronic device programmed or configured to perform one or more blocks of the method 500 described below with reference to FIG. 5. For example, the computing device 200 may include a mixed reality simulation application 199 that performs one or more blocks of the method 500 described below with reference to FIG. 5. In some embodiments, the mixed reality simulation application 199 is standalone software for generating a simulation. In other embodiments, the mixed reality simulation application 199 is a plug-in for existing simulation software.

In some embodiments, the processor 125 and the memory 127 may be elements of an onboard vehicle computer system. The onboard vehicle computer system may be operable to access and execute the data stored on the memory 127 to provide the functionality described herein for the mixed reality simulation application 199. The onboard vehicle computer system may be operable execute the mixed reality simulation application 199, which causes the onboard vehicle computer system to execute one or more of the steps of the method 500 described below with reference to FIG. 5.

The processor 225 includes an arithmetic logic unit, a microprocessor, a general-purpose controller, or some other processor array to perform computations and provide electronic display signals to a display device. The processor 225 processes data signals and may include various computing architectures including a complex instruction set computer (CISC) architecture, a reduced instruction set computer (RISC) architecture, or an architecture implementing a combination of instruction sets. Although FIG. 2 includes a single processor 225, multiple processors 225 may be included. The processor 225 may include a graphical processing unit. Other processors, operating systems, sensors, displays, and physical configurations may be possible. The processor 225 is communicatively coupled to the bus 220 via a signal line 238.

The memory 227 is a non-transitory storage medium that stores instructions or data that may be accessed and executed by the processor 225. The instructions or data may include code for performing the techniques described herein. The memory 227 may include a dynamic random-access memory (DRAM) device, a static random-access memory (SRAM) device, flash memory, or some other memory device. In some embodiments, the memory 227 also includes a non-volatile memory or similar permanent storage device and media including a hard disk drive, a floppy disk drive, a CD-ROM device, a DVD-ROM device, a DVD-RAM device, a DVD-RW device, a flash memory device, or some other mass storage device for storing information on a more permanent basis. The memory 227 is communicatively coupled to the bus 220 via a signal line 240.

The memory 227 may include one or more of the following elements: environmental element data 255, active agent data 257, active agent target trajectories data 259, simulated road test data 261, simulation data 263, and control system specification data 265. Although the elements are illustrated as being part of the memory 227, in some embodiments the different types of data are stored in different databases. For example, the environmental element data 255, the active agent data 257, and the active agent target trajectories data 259 may each be stored in a different database.

The environmental element data 255 is digital data that describes a sensor stream for environmental elements. The environmental element data 255 includes both real-world environmental elements and three-dimensional models of environmental elements. The environmental element data 255 may be updated with ADAS data that is generated by an ADAS system after the ADAS system is exposed to simulation data 263. For example, the environmental element data 255 may be updated with ADAS data generated by the control system 247 or the ADAS module 210 in response to a simulation. The environmental element data 255 is described in greater detail below with reference to FIG. 3A.

The active agent data 257 is digital data that describes a sensor stream for active agents. The active agent data 257 includes both real-world active agents and three-dimensional models of active agents. The active agent data 257 may be updated with ADAS data that is generated by an ADAS system after the ADAS system is exposed to simulation data 263. For example, the active agent data 257 may be updated with ADAS data generated by the control system 247 or the ADAS module 210 in response to a simulation. The active agent data 257 is described in greater detail below with reference to FIG. 3B.

The active agent target trajectories data 259 is digital data that describes a sensor stream for the trajectories of active agents. The active agent target trajectories data 259 may include real-world active agent trajectories, scripted behavior, and mathematical models. The active agent target trajectories data 259 may be updated with ADAS data that is generated by an ADAS system after the ADAS system is exposed to simulation data 263. For example, the active agent data 257 may be updated with ADAS data generated by the control system 247 or the ADAS module 210 in response to a simulation. The active agent target trajectories data 259 is described in greater detail below with reference to FIG. 3C.

The simulated road test data 261 is digital data that describes different types of roads. For example, the road test data 261 may include surface roads, highways, off-road terrains, etc. The simulated road test data 261 may include digital data describing real-world roads, virtual roads that are designed to test a variety of road conditions, or a mix of both real-world roads and virtual roads.

The simulation data 263 is digital data that describes a simulation environment that is built from the environmental element data 255, active agent data 257, active agent target trajectories data 259, and simulated road test data 261. In some embodiments, the mixed reality simulation application 199 generates different simulation environments using different environmental elements, active agents, and active agent target trajectories. For example, a first simulation environment is a surface street where the active agents include pedestrians and construction and a second simulation environment is a highway where the active agents include other vehicles.

The control system specification data 265 is digital data that describes how an ADAS system is expected to behave in response to environmental elements, active agents, and active agent trajectories. In some embodiments, the control system specification data 265 includes digital data that describes an industry or government-established safety standard for how an ADAS system is supposed to behave. The control system specification data 265 may include digital data that varies based on a make, model, and year of the vehicle. Different makes, models, and years of cars may support different levels and types of ADAS systems. As a result, the control system specification data 265 may include descriptions of how ADAS systems for Levels 0-5 are expected to react to environmental elements, active agents, and active agent trajectories.

In some embodiments, the memory 227 stores any data necessary for the mixed reality simulation application 199 to provide its functionality. For example, the memory 227 may store data that describes one or more elements of the simulated environment so that mixed reality simulation application 199 has data that may be used to generate the simulated environment. For example, the memory 227 may include some or all of the data or inputs described in U.S. patent application Ser. No. 15/013,936.

The communication unit 245 may include hardware that transmits and receives data to and from the network 105. In some embodiments, the communication unit 245 includes a port for direct physical connection to the network 105 or to another communication channel. For example, the communication unit 245 includes a USB, SD, CAT-5, or similar port for wired communication with the network 105. In some embodiments, the communication unit 245 includes a wireless transceiver for exchanging data with the network 105 or other communication channels using one or more wireless communication methods, including IEEE 802.11, IEEE 802.16, Bluetooth®, or another suitable wireless communication method. The communication unit 245 is communicatively coupled to the bus 220 via a signal line 242.

In some embodiments, the communication unit 245 includes a cellular communications transceiver for sending and receiving data over a cellular communications network including via SMS, MMS, HTTP, direct data connection, WAP, e-mail, or another suitable type of electronic communication. In some embodiments, the communication unit 245 includes a wired port and a wireless transceiver. The communication unit 245 also provides other conventional connections to the network 105 for distribution of files or media objects using standard network protocols including TCP/IP, HTTP, HTTPS, and SMTP, etc.

The mixed reality simulation application 199 may compare ADAS data that describes a reaction to simulation data 263 to the control system specification data 265 to determine whether the ADAS system reacts the way it is predicted to react. If the ADAS data differs from the control system specification data 265, it indicates an area where the ADAS design should be modified. For example, if the control system specification data 265 indicates that an autonomous vehicle would stop if the ADAS system detects a pedestrian walking across a walkway, but the ADAS data indicates that the ADAS system filed to stop the autonomous vehicle after detecting the pedestrian, the mixed reality simulation application 199 may modify the ADAS design for safety reasons.

The control system 247 is at least one of (1) hardware for implementing one or more ADAS systems and (2) software that is configured to act as one or more ADAS systems. The ADAS systems provide data about one or more autonomous features. In some embodiments, the control system 247 includes an onboard vehicle computer or electronic control units (ECUs) that control the one or more ADAS systems. The control system 247 is communicatively coupled to the bus 220 via a signal line 242.

In some embodiments, the mixed reality simulation application 199 provides the control system 247 with simulation data 263 that describes a simulation generated by the mixed reality simulation application 199 where the simulation is a mixed-reality simulation of a road test designed to test the performance of a vehicle control system versus its expected performance as described by its specification. The control system 247 may generate ADAS data that is a reaction to the simulation. For example, the simulation may include an active agent of a person that walks in front of a vehicle. The control system 247 may generate ADAS data describing how the control system 247 responds to the active agent.

In some embodiments, the control system 247 is configured to respond to a simulation using anywhere from Levels 0-5 of ADAS systems. Specifically, in some embodiments the control system 247 acts as one of the following ADAS systems: a Level 1 autonomous vehicle; a Level 2 autonomous vehicle; a Level 3 autonomous vehicle; a Level 4 autonomous vehicle; a Level 5 autonomous vehicle; and a highly autonomous vehicle (HAV), which is an autonomous vehicle that is Level 3 or higher. The different levels are described below.

Level 0: The set of ADAS systems installed in a vehicle have no vehicle control. The set of ADAS systems may issue warnings to the driver of the vehicle. A vehicle that is Level 0 is not an autonomous or semi-autonomous vehicle.

Level 1: The driver must be ready to take driving control of the autonomous vehicle at any time. The set of ADAS systems installed in the autonomous vehicle may provide autonomous features such as one or more of the following: ACC; and Parking Assistance with automated steering and Lane Keeping Assistance (LKA) Type II, in any combination.

Level 2: The driver is obliged to detect objects and events in the roadway environment and respond if the set of ADAS systems installed in the autonomous vehicle fail to respond properly (based on the driver's subjective judgement). The set of ADAS systems installed in the autonomous vehicle executes accelerating, braking, and steering. The set of ADAS systems 180 installed in the autonomous vehicle can deactivate immediately upon takeover by the driver.

Level 3: Within known, limited environments (such as freeways), the driver can safely turn their attention away from driving tasks but must still be prepared to take control of the autonomous vehicle when needed.

Level 4: The set of ADAS systems installed in the autonomous vehicle can control the autonomous vehicle in all but a few environments such as severe weather. The driver must enable the automated system (which is comprised of the set of ADAS systems 180 installed in the vehicle) only when it is safe to do so. When the automated system is enabled, driver attention is not required for the autonomous vehicle to operate safely and consistent with accepted norms.

Level 5: Other than setting the destination and starting the system, no human intervention is required. The automated system can drive to any location where it is legal to drive and make its own decision (which may vary based on the jurisdiction where the vehicle is located).

In some embodiments, the mixed reality simulation application 199 may include a special-purpose computing device configured to provide some or all of the functionality described above with reference to the mixed reality simulation application 199 or below with reference to method 500 described below with reference to FIG. 5.

The mixed reality simulation application 199 may include one or more of the following elements: a communication module 202, a processing module 204, a modelling module 206, a simulation module 208, and an ADAS module 210 that are each communicatively coupled to the bus 220.

In some embodiments, the components of the mixed reality simulation application 199 are local to the same hardware so that the bus 220 is not necessary for communication among the components of the mixed reality simulation application 199. In some embodiments, communication structures or methods other than the bus 220 may be implemented.

The communication module 202 may include code and routines configured to handle communications between the computing device 200 and other components of the operating environment 100. In some embodiments, the communication module 202 can be stored in the memory 227 of the computing device 200 and can be accessible and executable by the processor 225. The communication module 202 is communicatively coupled to the bus 220 via signal line 222.

The communication module 202 sends and receives data, via the communication unit 245, to and from the network 105. For example, the communication module 202 receives real-world sensor stream data 160 from the test vehicle 123, via the communication unit 245, to the network 105.

In some embodiments, the communication module 202 transmits data between components of the computing device 200. For example, the communication module 202 may store the real-world sensor stream data 160 in the memory 227. In another example, the communication module 202 may receive response data from the control system 247 and save the response data as part of the environmental element data 255, the active agent data 257, and/or the active agent target trajectories data 259.

In some embodiments, the communication module 202 receives data from components of the mixed reality simulation application 199 and stores the data in the memory 227. For example, the communication module 202 may receive environmental element data 255, active agent data 257, and active agent target trajectories data 259 from the processing module 204 and store each type of data in the memory 227.

The processing module 204 may include code and routines configured to generate environmental element data 255, active agent data 257, and active agent target trajectories data 259. The processing module 204 may organize the inputs. For example, the processing module 204 receives real-world sensor stream data 160 from the test vehicle 123, via the network 105; identifies the real-world environmental elements, the real-world active agents, and the real-world active agent trajectories from the real-world sensor stream data 160; and generates environmental element data 255, active agent data 257, and active agent target trajectories data 259 by combining the real-world data with three-dimensional models. The processing module 204 may also use the real-world sensor stream data 160 to generate a raw sensor map of the environment. In some embodiments, the processing module 204 can be stored in the memory 227 of the mixed reality simulation application 199 and can be accessible and executable by the processor 225. The processing module 204 is communicatively coupled to the bus 220 via signal line 224.

In some embodiments, the processing module 204 receives real-world sensor stream data 160 that describes a real-world data stream that is recorded by a sensor set 150 in a test vehicle 123 in combination with sensor measurements taken by other onboard sensors such as LIDAR, radar, ultrasonic sensors, etc. The real-world data stream may include video or images of the external environment of the test vehicle 123 and/or the internal environment of the test vehicle 123. The real-world data stream includes recordings of environmental elements and active agents. The processing module 204 may extract real-world environmental elements, real-world active agents, and real-world active agent trajectories from the real-world sensor stream data 160.

The environmental elements may include environmental details that are not critical to the behavior of an autonomous vehicle. For example, the environmental elements include lighting, sky, trees, road guards, etc. The processing module 204 may extract the environmental elements from the real-world sensor stream data 160 by identifying video or images that include the environmental elements and indexing the video or images with the environmental elements. The processing module 204 may identify environmental objects using neural networks for depth map estimation and segmentation, performing object recognition, using object priors, etc. For example, the processing module 204 may store images of a stop sign as environmental element data 255 identified as being a stop sign. The processing module 204 receives the three-dimensional models of environmental elements from the modeling module 206.

Figure 3A:
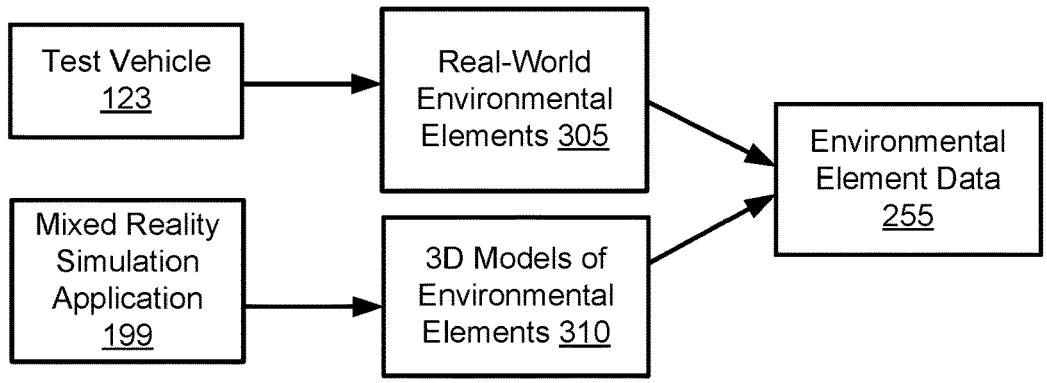
FIG. 3A is a block diagram illustrating real-world environmental elements and three-dimensional models of environmental elements that are stored as environmental element data according to some embodiments.

The processing module 204 may generate environmental element data 255 that includes both the real-world environmental elements and the three-dimensional models of environmental elements. FIG. 3A is a block diagram 300 that illustrates real-world environmental elements 305 and three-dimensional models of environmental elements 310 that are stored as environmental element data 255. In this example, the test vehicle 123 provides the real-world environmental elements 305 and the mixed reality simulation application 199 provides the three-dimensional models of environmental elements 310. The processing module 204 may instruct the communication module 202 to store both the real-world environmental elements 305 and the three-dimensional elements 310 as environmental element data 255.

The active agents may include objects that affect the decision making of one or more ADAS systems. For example, the active agents include nearby vehicles, pedestrians, etc. The processing module 204 may extract the active agents from the real-world sensor stream data 160 by using neural networks for depth map estimation and segmentation, performing object recognition, using object priors, identifying video or images that include the active agents, indexing the video or images with the active agents, etc. The processing module 204 may identify environmental objects performing object recognition, facial recognition, and/or person recognition. For example, the processing module 204 may store images of a pedestrian as active agent data 257.

Figure 3B:
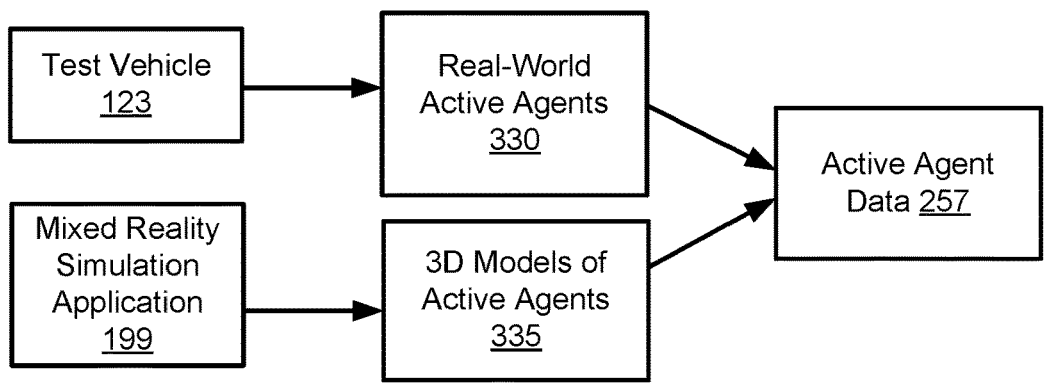
FIG. 3B is a block diagram illustrating real-world recorded active agents and three-dimensional models of active agents that are stored as active agent data according to some embodiments.

The processing module 204 may generate active agent data 257 that includes both the real-world active agents and the three-dimensional models of active agents. FIG. 3B is a block diagram 325 that illustrates real-world active agents 330 and three-dimensional models of active 335 agents that are stored as active agent data 257 according to some embodiments. In this example, the test vehicle 123 provides the real-world active agents 330 and the mixed reality simulation application 199 provides the three-dimensional models of active agents 335. In some embodiments, the three-dimensional models of environmental elements 310 are automatically generated by agent software that is separate from the mixed reality simulation application 199. The processing module 204 may instruct the communication module 202 to store both the real-world active agents 330 and the three-dimensional models of active agents 335 as active agent data 257.

The active agent target trajectories may include trajectories of active agents. For example, the active agent target trajectories may include descriptions of movement of nearby vehicles, pedestrians, etc. The processing module 204 may extract the behavior of active agents from the real-world sensor stream data 160 by identifying video or images that include the active agents and record information about the trajectories.

Figure 3C:
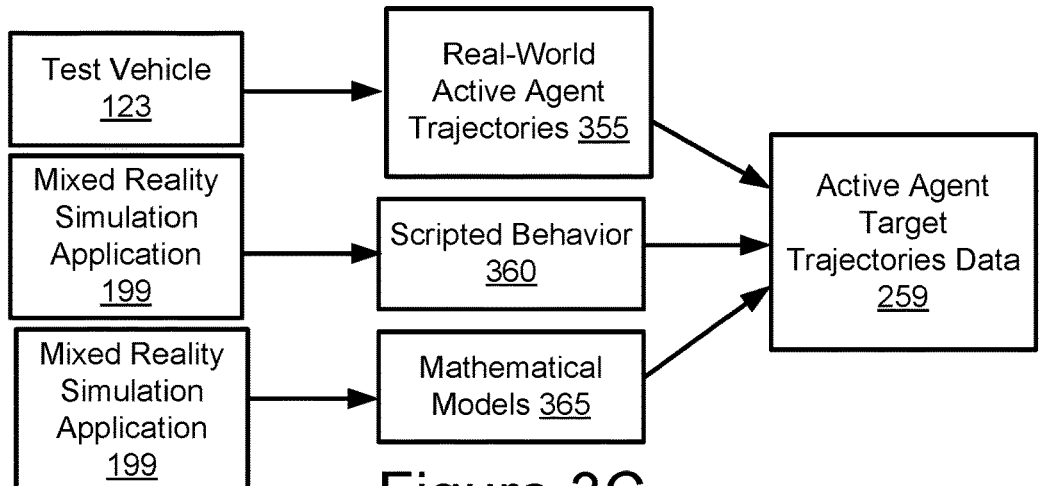
FIG. 3C is a block diagram illustrating real-world active agent trajectories, scripted behavior, and mathematical models that are stored as active agent target trajectories data according to some embodiments.

The processing module 204 may generate active agent target trajectories data 259 that includes the real-world active agent trajectories, the scripted behavior, and the mathematical models. FIG. 3C is a block diagram 350 that illustrates real-world active agent trajectories 355, scripted behavior 360, and mathematical models 365 that are stored as active agent target trajectories data 259 according to some embodiments. In this example, the test vehicle 123 provides the real-world active agent trajectories 355, and the mixed reality simulation application 199 provides the scripted behavior 360 and the mathematical models 365. The scripted behavior 360 and the mathematical models 365 may be based on inputs from a user (e.g., a test engineer) or automatically generated by the processing module 204. The processing module 204 may instruct the communication module 202 to store both the real-world active agents 330 and the three-dimensional models of active agents 335 as active agent data 257.

In this way, the processing module 204 is advantageous over traditional virtualized simulations of road tests, because the processing module 204 generates databases that are a combination of three-dimensional models and real-world environmental elements and active agents. Conversely, the traditional virtualized simulations are entirely constructed by virtualized test elements written by users (e.g., test engineers).

The modeling module 206 may include code and routines configured to generate a model. In some embodiments, the modeling module 206 can be stored in the memory 227 of the mixed reality simulation application 199 and can be accessible and executable by the processor 225. The modeling module 206 is communicatively coupled to the bus 220 via signal line 226. Although the modeling module 206 is illustrated as being a component of the mixed reality simulation application 199, in some embodiments, the modeling module 206 is agent software that is separate from the mixed reality simulation application 199.

The modeling module 206 generates three-dimensional models of environmental elements. In some embodiments, the modeling module 206 automatically generates the three-dimensional models of environmental elements. For example, the modeling module 206 may generate a library of environmental objects that includes graphic images of a tree, a parking sign, etc. In another example, the modeling module 206 receives input from a user (e.g., a test engineer) and uses the input to generate the three-dimensional models of environmental elements. For example, the test engineer may provide information about the size of a stop sign, the color of the stop sign, the expected location for a stop sign, etc. In some embodiments, the modeling module 206 generates graphical data for displaying a user interface that includes fields for receiving input from the test engineer. The modeling module 206 may transmit the three-dimensional models of environmental elements to the processing module 204 for processing.

The modeling module 206 generates three-dimensional models of active agents. In some embodiments, the modeling module 206 automatically generates the three-dimensional models of active agents. For example, the modeling module 206 may generate a library of active agents that includes graphic images of a pedestrian, a nearby vehicle, a bicycle, etc. In another example, the modeling module 206 receives input from a user (e.g., a test engineer) and uses the input to generate the three-dimensional models of active agents. For example, the test engineer may provide information about the size of a pedestrian; makes, models, and years of different vehicles; different types of vehicles, etc. In some embodiments, the modeling module 206 generates graphical data for displaying a user interface that includes fields for receiving input from the test engineer. The modeling module 206 may transmit the three-dimensional models of active agents to the processing module 204 for processing.

The modeling module 206 generates scripted behavior and mathematical models that describe the trajectories of active agents. In some embodiments, the modeling module 206 automatically generates the scripted behavior and mathematical models that describe the trajectories of active agents. The scripted behavior may describe expected movement for a particular active agent, such as how an active agent reacts to a particular event.

The mathematical models may describe the coordinates of movement for the particular active agents. In some embodiments, the modeling module 206 may use computer-aided drafting (CAD) models, trajectories, and kinematic/dynamic behavior to generate the mathematical models. In some embodiments, the modeling module 206 may generate mathematical models of active agents that track their target trajectory via a series of waypoints by making prediction models for the expected behavior of surrounding active agents given a certain behavior of a vehicle. For example, waypoints may be used for a path specification and for defining a start region and an end region for a path specification.

For example, a model of a walking path for a virtual pedestrian may include zero or more directional changes as the virtual pedestrian crosses an intersection. A point at which the virtual pedestrian changes their direction is referred to as a waypoint. The model may index the walking path using coverage criteria with known boundary parameters of a rectangular area for a start region and a rectangular area for an end region. The coverage criteria may define a degree of the directional changes by a virtual pedestrian while crossing an intersection. The degree of directional changes may be characterized by the coverage criteria with using any three consecutive waypoints on a walking path. For example, the degree of the three directional changes, $\theta_1$, $\theta_2$ and $\theta_3$ are characterized in terms of the following three sets of coordinates: $\{(4,0), (3,5), (4,10)\}$, $\{(3,5),(4,10),(1,15)\}$ and $\{(4,10), (1,15), (0,35)\}$. The coverage criteria are expressed setting these coordinates as unknown variables in the in the coverage criteria, while setting the minimum and maximum bounds of directional changes as known variables in the coverage criteria.

The modeling module 206 may further categorize the active agents using different categories of different drivers and pedestrians. For example, active agents may be categorized as aggressive, passive, male, female, adult, child, etc. The modeling module 206 may use the scripted behavior and the mathematical models to describe the target trajectories of active agents. For example, the modeling module 206 may determine, based on scripted behavior, that a pedestrian that is 4'5, 100 pounds, and a child moves more quickly with more unpredictable movement than a pedestrian that is 5'5, 240 pounds, and an adult. The modeling module 206 may determine, based on mathematical models of moving pedestrians, the trajectories of active agents. The modeling module 206 may transmit the scripted behavior and the mathematical models to the processing module 204 for processing.

The simulation module 208 may include code and routines configured to generate a simulation. In some embodiments, the simulation module 208 can be stored in the memory 227 of the mixed reality simulation application 199 and can be accessible and executable by the processor 225. The simulation module 208 is communicatively coupled to the bus 220 via signal line 228.

In some embodiments, the simulation module 208 generates a simulation of the vehicle environment that synthesizes the real-world environmental elements with the three-dimensional models of environmental elements; the real-world active agents with three-dimensional models of active agents; and the real-world active agent trajectories with scripted behavior and mathematical models of active agent trajectories.

In some embodiments, the simulation module 208 builds the simulation from different environmental elements, active agents, target trajectories for active agents, and roads. The simulation module 208 may retrieve environmental element data 255, active agent data 257, active agent target trajectory data 259, and simulated road test data 261 to build a simulation with environmental elements, active agents, target trajectories for active agents, and roads where the environmental elements, the active agents, and target trajectories for active agents are generated from mixed-reality streams.

The simulation module 208 may synthesize data streams for each of the onboard sensors of the sensor set 150 from the test vehicle 123. For example, the simulation module 208 may generate a mixed-reality stream for the camera that adds a small image of the vehicle in the right orientation. For LIDAR, radar, and/or ultrasonic sensors, the simulation module 208 may manipulate the depths around a simulated vehicle using a three-dimensional model of the active agent. The three-dimensional model may contain material properties to develop accurate simulated laser sensor data. The simulation module 208 may resolve differences in the mixed-reality streams that are derived from lighting, weather, noise, etc. and generate a simulation with a consistent appearance.

The simulation module 208 may build the simulation for different elements, active agents, target trajectories for active agents, and roads automatically or responsive to input from a user (e.g., a test engineer). For embodiments where the simulation module 208 builds the simulation based on input from the test engineer, in some embodiments, the simulation module 208 generates graphical data for displaying a user interface that the test engineer uses to select the different environmental elements, active agents, target trajectories for active agents, and roads. For example, the user interface may include images of different environmental elements, active agents, target trajectories for active agents, and roads and the test engineer can mix and match different items to form a simulation. In some embodiments, the simulation module 208 may use the recordings of real-world environmental elements, real-world active agents, and real-world active agent trajectories to create a recorded environment and then superimposes environmental elements and active agents onto the recorded environment.

Figure 4A:
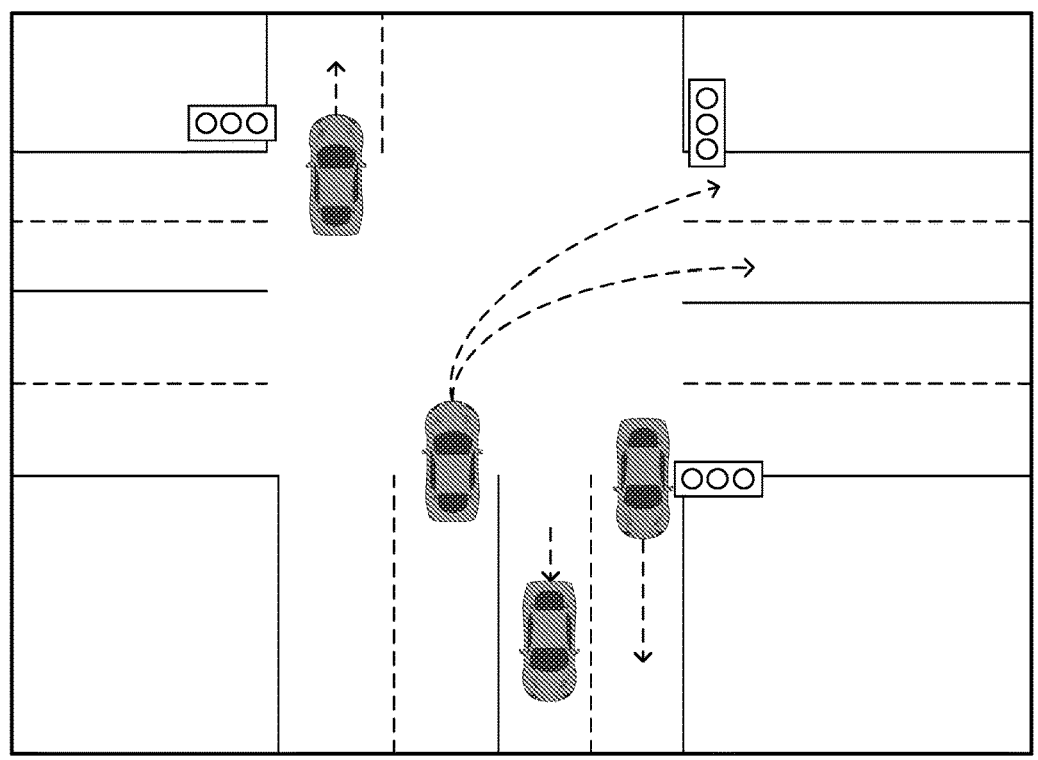
FIG. 4A is a block diagram illustrating an example user interface for designing a simulation according to some embodiments.

Turning to FIG. 4A, is a block diagram 400 illustrates an example user interface for designing a simulation according to some embodiments. In this example, a user (e.g., a test engineer) may design a two-dimensional simulation by specifying a number of roads, a number of vehicles that behave as active agents, a number of traffic lights (e.g. traffic lights), etc. In some embodiments including the embodiment illustrated in FIG. 4A, the environment may be designed by illustrating a top-down view of the environment that is based on satellite imagery.

Figure 4B:
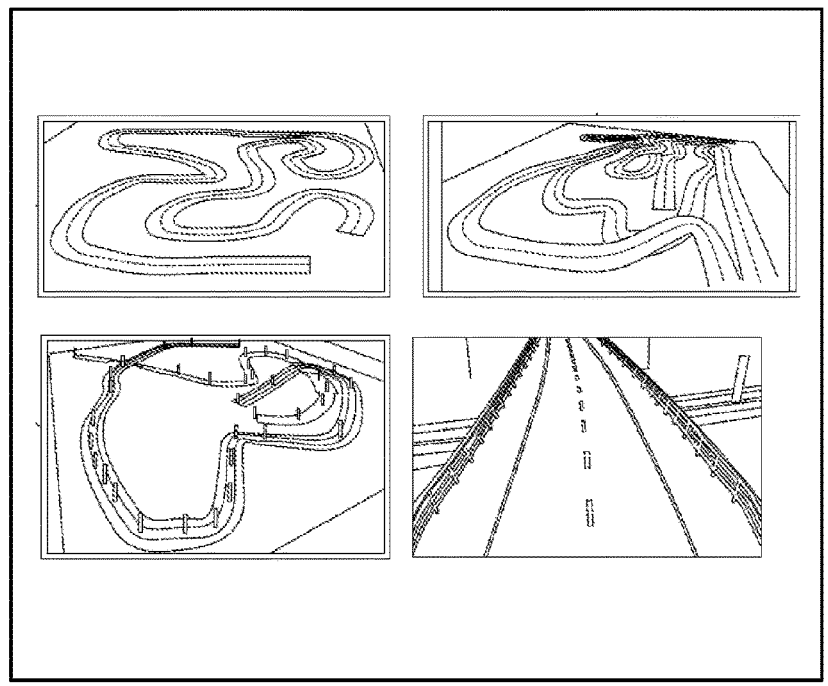
FIG. 4B is a block diagram illustrating an example user interface that includes sample roads for designing roads for a simulation according to some embodiments.

Turning to FIG. 4B, a block diagram 425 illustrates an example user interface that includes sample roads for designing a simulation according to some embodiments. In this example, a user (e.g., a test engineer) may select the type of roads that are part of the simulation. Other user interfaces are possible, such as a drop-down menu with test describing the types of roads.

Figure 4C:
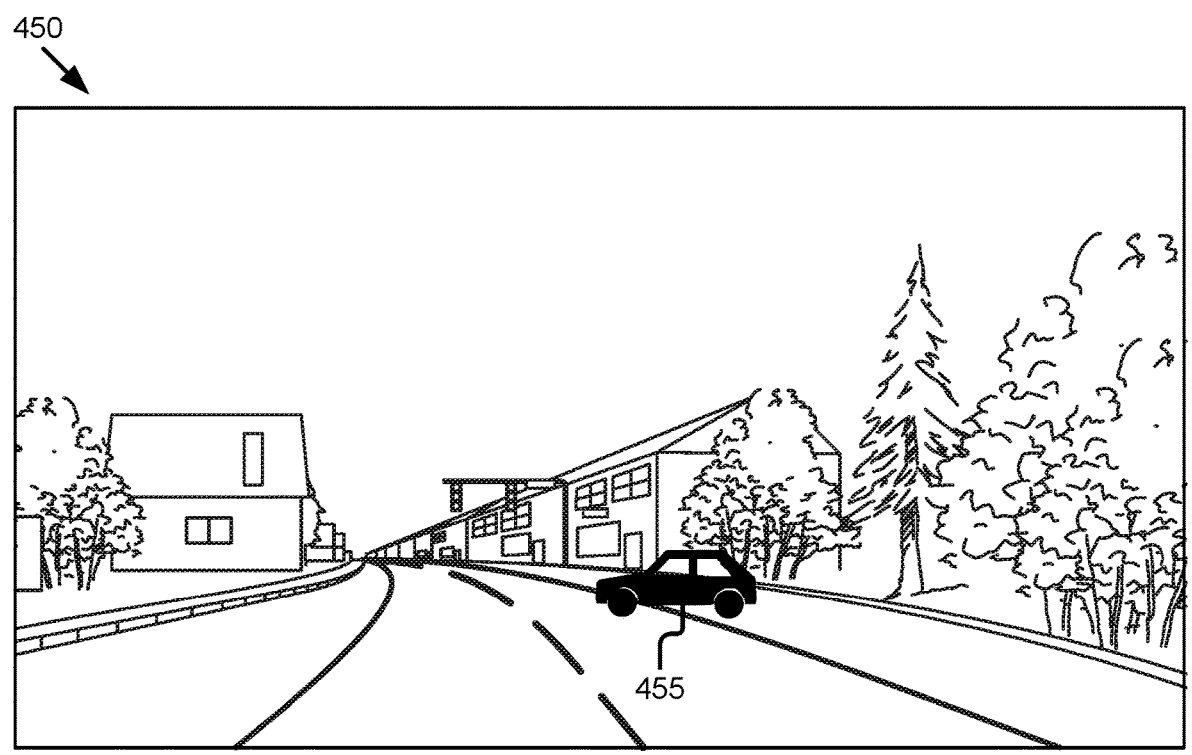
FIG. 4C is a block diagram illustrating an example of a real-world sensor stream recorded by a test vehicle and used in the simulation according to some embodiments.

Turning to FIG. 4C, a block diagram 450 illustrates an example of a real-world sensor stream recorded by a test vehicle and used in the simulation according to some embodiments. In this example, the real-world sensor stream included a video of a road where a car 455 moves from the shoulder to the road. The processing module 204 may have saved data about the car 455 as active agent data 257 because the car 455 is a moving vehicle and active agent target trajectories data 259 because the car 455 moves with a particular trajectory. The simulation module 208 may update the scripted behavior and the mathematical model for an active agent moving from the shoulder to the road with the real-world sensor stream.

In some embodiments, where the real-world data stream includes a sensor stream for each of the onboard sensors from the sensor set 150 in the one or more test vehicles 123, the simulation module 208 generates mixed-reality streams that are a mix of the sensor stream for each of the onboard sensors with the three-dimensional models of active agents, scripted behavior, mathematical models, and the three-dimensional models of environmental elements. The simulation module 208 may generate the simulation based on the mixed-reality streams. In some embodiments, the simulation module 208 generates the mixed-reality streams while the road tests in the simulation are executed. As described below with reference to the ADAS module 210, the control system 247 responds to the simulation and generates response data. The response data may be used by the simulation module 208 to update the mixed-reality streams and/or to modify the ADAS system.

In some embodiments, the simulation module 208 may determine that the real-world sensor stream data 160 is missing data. For example, the simulation module 208 may determine that the real-world sensor stream data 160 is lacking a depth image for an element that was selected for inclusion in the simulation. The simulation module 208 may use neural networks or other extrapolation algorithms to generate an approximation of the data that is missing in the real-world sensor stream data 160.

Other example embodiments for generating a digital simulation are described in U.S. patent application Ser. No. 15/847,081 filed on Dec. 19, 2017 and entitled "Automatic Generation of Pedestrians in Virtual Simulation of Roadway Intersections" and U.S. patent application Ser. No. 15/013,936 filed on Feb. 2, 2016 and entitled "Realistic Roadway Virtualization System," each of which is herein incorporated by reference. Additional example embodiments for generating a digital simulation to test a performance of a virtual ADAS system are described in U.S. patent application Ser. No. 15/159,233 filed on May 19, 2016 and entitled "User Profile-Based Automatic Parameter Tuning System for Connected Vehicles," the entirety of which is herein incorporated by reference.

The simulation module 208 may generate simulation data 263 that describes the simulation. The simulation data 263 may include the environmental element data 255, the active agent data 257, the active agent target trajectories data 259, and the simulated road test data 261 that correspond to environmental elements, active agents, active agent target trajectories, and road tests selected for the particular simulation.

In some embodiments, the simulation module 208 exposes a control system 247 to the simulation where the control system 247 is associated with an ADAS system. For example, the simulation module 208 may provide the simulation data 263 to the control system 247.

The simulation module 208 may provide initial conditions of the vehicle environment that includes one or more of the three-dimensional models of environmental elements, three-dimensional models of active agents, scripted behavior, and mathematical models. In some embodiments, the initial conditions are independent of the mixed-reality streams and the mixed-reality streams are added after the control system 247 starts reacting to the simulation.

The control system 247 may generate response data and the simulation module 208 may update the mixed-reality streams for each sensor based on the response data. In some embodiments, the simulation module 208 exposes the control system 247 to the simulation and updates the mixed-reality streams for each sensor until an undesirable behavior is detected. For example, the real-world sensor stream data 160 may describe video that is recorded from a unique perspective that may change depending on the actions of the test vehicle 123. To resolve this, the simulation module 208 may extrapolate data from the sensor streams accordingly (e.g., generate a depth map for a point cloud of the simulation environment, and use the point cloud as reference coordinates to project an image). This typically only applies to recorded data streams (e.g., recoded environmental elements or recorded active agents) and not three-dimensional models that do not need modification or distortion.

The ADAS module 210 may include code and routines configured to compare response data to an ADAS system. In some embodiments, the ADAS module 210 can be stored in the memory 227 of the mixed reality simulation application 199 and can be accessible and executable by the processor 225. The ADAS module 210 is communicatively coupled to the bus 220 via signal line 230.

The ADAS module 210 may control a virtual ADAS system that reacts to the simulation generated by the simulation module 208. In some embodiments, the ADAS module 210 communicates with the control system 247, for example, by gathering response data generated by the control system 247 in response to being exposed to the simulation.

For example, the control system 247 detects a presence of a virtual pedestrian crossing an intersection in a virtual roadway environment. The control system 247 automatically engages the braking system of a virtual vehicle so that the virtual vehicle does not collide with the virtual pedestrian or encroach upon the area proximate to the virtual pedestrian. In another example, the control system 247 provides a notification to a virtualized driver of the virtual vehicle that is intended to cause the driver to engage the braking system of the virtual vehicle. In yet another example, the control system 247 automatically causes the virtual vehicle to steer in a direction that is away from the virtual pedestrian or the trajectory of the virtual pedestrian.

In some embodiments, the ADAS module 210 compares response data of the control system 247 to a specification for the design of the ADAS system as described by the control system specification data 265 to assess an operation of the control system 247. The ADAS module 210 may measure and assess the operation of the control system 247 by comparing the response data from the control system 247 to control system specification data 265 for each recorded time to determine whether the response data is within a reasonable range of the control system specification data 265. The ADAS module 210 may modify or recommend a modification to an ADAS system based on the measurement and assessment of the operation of the control system 247. For example, if the response data is outside a reasonable range of the control system specification data 265, the ADAS module 210 may modify the design of an ADAS system.

In continuing with the example above, the ADAS module 210 analyzes the performance of the control system 247 for protecting the virtual pedestrians when responding to virtual pedestrians crossing intersections included in the one or more simulations. For example, the ADAS module 210 assesses how quickly the virtual vehicle engaged its braking system and other variables that indicate whether the virtual ADAS system adequately protected the virtual pedestrians based on the design specification for the ADAS system as described by the control system specification data 265. In this way the ADAS module 210 analyzes the one or more simulations to determine whether the virtual ADAS system operated in compliance with its design specification. If the ADAS module 210 determines that the virtual ADAS system did not perform in compliance with its design specification, then the ADAS module 210 determines recommendations for modifying the design of the virtual ADAS system (e.g., the ADAS model data 196) so that the virtual ADAS system will operate in a manner that complies with its design specification.

Example Method

Figure 5:
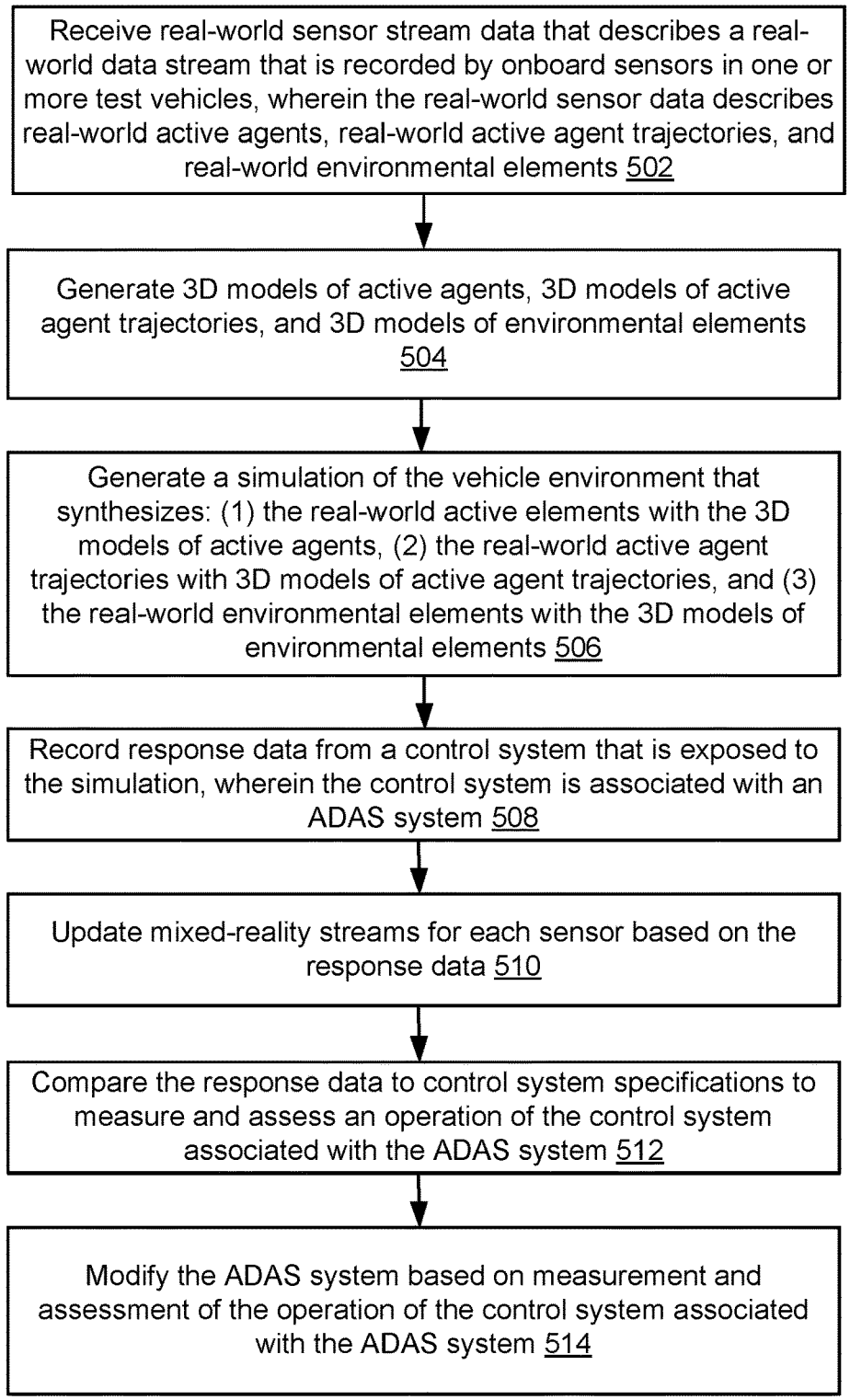
FIG. 5 is a flow diagram illustrating steps for generating a simulation from real-world sensor stream data and three-dimensional models that is used to design an advanced driver assistance system according to some embodiments.

Referring now to FIG. 5, depicted is a flow diagram of an example method 500 for generating a simulation from real-world sensor stream data and three-dimensional models that is used to design an advanced driver assistance system. In some embodiments, the method 500 is performed by a mixed reality simulation application 199 stored on the server 101. In other embodiments, the method 500 is performed in part by a mixed reality simulation application 199 stored on the server 101, a mixed reality simulation application 199 stored on the test vehicle 123, or a combination of the server 101 and the test vehicle 123.

At step 502, real-world sensor stream data 160 is received that describes a real-world data stream that is recorded by onboard sensors in one or more test vehicles 123, where the real-world sensor stream data 160 describes real-world active agents, real-world active agent trajectories, and real-world environmental elements.

At step 504, three-dimensional models of active agents, three-dimensional models of active agent trajectories, and three-dimensional models of environmental elements are generated.

At step 506, a simulation of the vehicle environment is generated that synthesizes: (1) the real-world active elements with the three-dimensional models of active agents, (2) the real-world active agent trajectories with three-dimensional models of active agent trajectories, and (3) the real-world environmental elements with the three-dimensional models of environmental elements.

At step 508, response data from a control system 247 that is exposed to the simulation is recorded, where the control system is associated with an ADAS system.

At step 510, mixed-reality streams for each sensor are updated based on the response data.

At step 512, the response data is compared to control system specifications to measure and assess an operation of the control system 247 associated with the ADAS system.

At step 514, the ADAS system is modified based on measurement and assessment of the operation of the control system 247 associated with the ADAS system.

In the above description, for purposes of explanation, numerous specific details are set forth in order to provide a thorough understanding of this disclosure. It will be apparent, however, to one skilled in the art that the disclosure can be practiced without these specific details. In some instances, structures and devices are shown in block diagram form in order to avoid obscuring the description. For example, the present embodiments can be described above primarily with reference to user interfaces and particular hardware. However, the present embodiments can apply to any type of computing device that can receive data and commands, and any peripheral devices providing services.

Reference in this disclosure to "some embodiments" or "some instances" means that a particular feature, structure, or characteristic described in connection with the embodiments or instances can be included in at least one embodiment of the description. The appearances of the phrase "In some embodiments" in various places in this disclosure are not necessarily all referring to the same embodiments.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms including "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present embodiments of this disclosure can also relate to an apparatus for performing the operations herein. This apparatus may be specially constructed for the required purposes, or it may include a general-purpose computer selectively activated or reconfigured by a computer program stored in the computer. Such a computer program may be stored in a computer-readable storage medium, including, but is not limited to, any type of disk including floppy disks, optical disks, CD-ROMs, and magnetic disks, read-only memories (ROMs), random access memories (RAMs), EPROMs, EEPROMs, magnetic or optical cards, flash memories including USB keys with non-volatile memory, or any type of media suitable for storing electronic instructions, each coupled to a computer system bus.

This disclosure can take the form of some entirely hardware embodiments, some entirely software embodiments or some embodiments containing both hardware and software elements. In some preferred embodiments, this disclosure is implemented in software, which includes, but is not limited to, firmware, resident software, microcode, etc.

Furthermore, the description can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device. The computer-readable medium may be a tangible or non-transitory computer-readable storage medium. The computer-readable medium may store computer executable code. The computer-readable medium may be communicatively coupled to a processor. The processor may be programmed to execute one or more portions of the computer-executable code.

A data processing system suitable for storing or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including, but not limited, to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem, and Ethernet cards are just a few of the currently available types of network adapters.

Finally, the algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, this disclosure is not described with reference to any particular programming language. It will be appreciated that a variety of programming languages may be used to implement the teachings of this disclosure as described herein.

The foregoing description of the embodiments of this disclosure has been presented for the purposes of illustration and description. It is not intended to be exhaustive or to limit this disclosure to the precise form disclosed. Many modifications and variations are possible in light of the above teaching. It is intended that the scope of the disclosure be limited not by this detailed description, but rather by the claims of this application. As will be understood by those familiar with the art, this disclosure may be embodied in other specific forms without departing from the spirit or essential characteristics thereof. Likewise, the particular naming and division of the modules, routines, features, attributes, methodologies, and other aspects are not mandatory or significant, and the mechanisms that implement this disclosure or its features may have different names, divisions, or formats. Furthermore, as will be apparent to one of ordinary skill in the relevant art, the modules, routines, features, attributes, methodologies, and other aspects of the disclosure can be implemented as software, hardware, firmware, or any combination of the three. Also, wherever a component, an example of which is a module, of this disclosure is implemented as software, the component can be implemented as a standalone program, as part of a larger program, as a plurality of separate programs, as a statically or dynamically linked library, as a kernel-loadable module, as a device driver, or in every and any other way known now or in the future to those of ordinary skill in the art of computer programming. Additionally, the disclosure is in no way limited to embodiment in any specific programming language, or for any specific operating system or environment. Accordingly, the disclosure is intended to be illustrative, but not limiting, of the scope of this disclosure, which is set forth in the following claims.

What is claimed is:

1. A computing-implemented method comprising:
receiving real-world sensor stream data that describes real-world active agents and real-world environmental elements;
generating three-dimensional (3D) models of active agents and 3D models of environmental elements in a vehicle environment;
generating a simulation of the vehicle environment;
recording response data from a control system that is exposed to the simulation, wherein the control system is associated with an advanced driver assistance system (ADAS system); and
modifying a design of the ADAS system based on the response data by:
comparing the response data to a specification for the design of the ADAS system and identifying an operation performed by the ADAS system;
determining whether the response data is within a specified range as described by the specification; and
modifying the design for the operation based on the response data being outside the specified range.

2. The method of claim 1, wherein:
the real-world sensor stream data describes a sensor stream for each onboard sensor in one or more test vehicles; and
the simulation is generated from mixed-reality streams that are a mix of the sensor stream for each of the onboard sensors in the one or more test vehicles with the 3D models of active agents and the 3D models of environmental elements.

3. The method of claim 2, further comprising:
updating the mixed-reality streams for each sensor based on the response data.

4. The method of claim 1, wherein comparing the response data to the specification includes determining how quickly the operation was performed.

5. The method of claim 1, wherein:
the real-world sensor stream data further describes real-world active agent trajectories,
the method further comprises generating scripted behavior and mathematical models of active agent trajectories, and
generating the simulation includes synthesizing the real-world active agent trajectories with the scripted behavior and the mathematical models of active agent trajectories.

6. The method of claim 1, further comprising:
providing initial conditions of the vehicle environment that includes the 3D models of active agents.

7. The method of claim 1, further comprising:
comparing the response data to control system specifications to measure and assess an operation of the control system associated with an autonomous vehicle.

8. The method of claim 7, further comprising:
modifying the ADAS system based on measurement and assessment of the operation of the control system associated with the ADAS system.

9. A system comprising:
one or more processors; and
a memory that stores instructions that, when executed by the one or more processors cause the one or more processors to perform operations comprising:
receiving real-world sensor stream data that describes real-world active agents and real-world environmental elements;
generating three-dimensional (3D) models of active agents and 3D models of environmental elements in a vehicle environment;
generating a simulation of the vehicle environment;
recording response data from a control system that is exposed to the simulation, wherein the control system is associated with an advanced driver assistance system (ADAS system); and modifying a design of the ADAS system based on the response data by:
  comparing the response data to a specification for the design of the ADAS system and identifying an operation performed by the ADAS system;
  determining whether the response data is within a specified range as described by the specification; and
  modifying the design for the operation based on the response data being outside the specified range.

10. The system of claim 9, wherein:
the real-world sensor stream data describes a sensor stream for each onboard sensor in one or more test vehicles; and
the simulation is generated from mixed-reality streams that are a mix of the sensor stream for each of the onboard sensors in the one or more test vehicles with the 3D models of active agents and the 3D models of environmental elements.

11. The system of claim 10, wherein the memory stores additional instructions that, when executed by the one or more processors cause the one or more processors to perform operations comprising:
  updating the mixed-reality streams for each sensor based on the response data.

12. The system of claim 10, wherein comparing the response data to a specification includes determining whether the operation protected a virtual pedestrian based on the specification for the design.

13. The system of claim 9, wherein:
the real-world sensor stream data further describes real-world active agent trajectories,
the memory stores additional instructions that, when executed by the one or more processors cause the one or more processors to perform operations comprising generating scripted behavior and mathematical models of active agent trajectories, and
generating the simulation includes synthesizing the real-world active agent trajectories with the scripted behavior and the mathematical models of active agent trajectories.

14. The system of claim 9, wherein the memory stores additional instructions that, when executed by the one or more processors cause the one or more processors to perform operations comprising:
  providing initial conditions of the vehicle environment that includes the 3D models of active agents.

15. A non-transitory memory comprising computer code which, when executed by a processor, causes the processor to perform steps comprising:
  receiving real-world sensor stream data that describes real-world active agents and real-world environmental elements;
  generating three-dimensional (3D) models of active agents and 3D models of environmental elements in a vehicle environment;
  generating a simulation of the vehicle environment that synthesizes;
  recording response data from a control system that is exposed to the simulation, wherein the control system is associated with an advanced driver assistance system (ADAS system); and
  modifying a design of the ADAS system based on the response data by:
    comparing the response data to a specification for the design of the ADAS system and identifying an operation performed by the ADAS system;
    determining whether the response data is within a specified range as described by the specification; and
    modifying the design for the operation based on the response data being outside the specified range.

16. The non-transitory memory of claim 15, wherein:
the real-world sensor stream data describes a sensor stream for each onboard sensor in one or more test vehicles; and
the simulation is generated from mixed-reality streams that are a mix of the sensor stream for each of the onboard sensors in the one or more test vehicles with the 3D models of active agents and the 3D models of environmental elements.

17. The non-transitory memory of claim 16, wherein the steps further comprise:
  updating the mixed-reality streams for each sensor based on the response data.

18. The non-transitory memory of claim 15, wherein modifying the design for the operation includes modifying the operation to comply with the specification for the design.

19. The non-transitory memory of claim 15, wherein:
the real-world sensor stream data further describes real-world active agent trajectories,
the steps further comprise generating scripted behavior and mathematical models of active agent trajectories, and
generating the simulation includes synthesizing the real-world active agent trajectories with the scripted behavior and the mathematical models of active agent trajectories.

20. The non-transitory memory of claim 15, wherein the steps further comprise:
  providing initial conditions of the vehicle environment that includes the 3D models of active agents.

* * * * *